(12) United States Patent
Regnet et al.

(10) Patent No.: US 7,046,129 B2
(45) Date of Patent: May 16, 2006

(54) DEVICE FOR DETECTING AN OBSTACLE IN THE OPENING RANGE OF A MOVABLE CLOSURE ELEMENT

(75) Inventors: Helmut Regnet, Lindau (DE); Gunther Kopp, Langenargen (DE)

(73) Assignee: Metzler Automotive Profile Systems GmbH, Lindau (DE)

( * ) Notice: Subject to any disclaimer, the term of this patent is extended or adjusted under 35 U.S.C. 154(b) by 112 days.

(21) Appl. No.: 10/795,722

(22) Filed: Mar. 5, 2004

(65) Prior Publication Data

US 2004/0172879 A1    Sep. 9, 2004

(30) Foreign Application Priority Data

Mar. 7, 2003    (DE) ................ 103 10 066

(51) Int. Cl.
*B60Q 1/00*    (2006.01)

(52) U.S. Cl. ............ 340/438; 340/426.27; 340/561; 340/562

(58) Field of Classification Search ........ 340/438, 340/426.24, 426.5, 426.27, 540, 545.1, 545.4, 340/561, 562, 602; 318/445, 466, 483; 324/693
See application file for complete search history.

(56) References Cited

U.S. PATENT DOCUMENTS

| | | | |
|---|---|---|---|
| 5,027,552 A | | 7/1991 | Miller et al. |
| 5,966,071 A * | 10/1999 | Tsuge et al. ........... 340/438 |
| 6,337,549 B1 * | 1/2002 | Bledin ................... 318/466 |
| 6,337,550 B1 * | 1/2002 | Takahashi et al. ...... 318/483 |
| 6,347,482 B1 * | 2/2002 | Takiguchi et al. ........ 49/28 |
| 6,389,752 B1 | 5/2002 | Rosenau ................... 49/28 |
| 6,680,618 B1 * | 1/2004 | Otani et al. ............ 324/693 |

FOREIGN PATENT DOCUMENTS

| | | |
|---|---|---|
| DE | 40 13 624 A1 | 10/1990 |
| DE | 4320548 A1 | 3/1994 |

(Continued)

OTHER PUBLICATIONS

English language abstract of DE 4320548.

(Continued)

*Primary Examiner*—Van T. Trieu
(74) *Attorney, Agent, or Firm*—Stephen B. Salai, Esq.; Brian B. Shaw, Esq.; Harter, Secrest & Emery LLP

(57) ABSTRACT

A device for detecting an obstacle in the opening range of a movable closure element (13), more particularly an electrically powered window pane (13) or sunroof of a motor vehicle (10), comprises a sensor electrode (20), a base electrode (21) spaced away from the sensor electrode (20), and a control unit (40) connected to the sensor electrode (20) and the base electrode (21). The sensor electrode (20) and the base electrode (21) generate an electric field (F) in the opening range of the closure element (13) and are spaced away at a constant distance from each other in a first operational mode. The control unit (40) detects in the first operational mode a change in capacitance caused by the presence of an obstacle in the electric field (F) and providing at least one control signal ($I_s$, $I_p$) for a drive (50) powering the closure element (13). The device is characterized by high reliability in operation and availability. The reason for this is that the control unit (40) provides in a second operational mode a control signal ($I_s$) for the drive (50) powering the closure element (13) when the sensor electrode (20) comes into electrical contact with the base electrode (21).

10 Claims, 5 Drawing Sheets

FOREIGN PATENT DOCUMENTS

| | | |
|---|---|---|
| DE | 44 16 803 A1 | 11/1994 |
| DE | 197 24 952 A1 | 12/1997 |
| DE | 19906562 A1 | 8/1999 |
| DE | 19913105 A1 | 10/2000 |
| EP | 0638701 A2 | 2/1995 |
| EP | 0648628 A1 | 4/1995 |
| EP | 0 856 425 1 A1 | 8/1998 |
| EP | 1154110 A2 | 11/2001 |
| GB | 2 301 622 A | 12/1996 |
| GB | 2 340 662 A | 2/2000 |
| JP | 10-110 574 A | 4/1998 |
| JP | 2000-177380 A | 6/2000 |

OTHER PUBLICATIONS

English language abstract of DE 19906562.
English language abstract of DE 19913105.
English language abstract of EP 0638701.
English language abstract of EP 0648628.
English language abstract of EP 1154110.

* cited by examiner

DEVICE FOR DETECTING AN OBSTACLE IN THE OPENING RANGE OF A MOVABLE CLOSURE ELEMENT

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A "SEQUENCE LISTING"

Not applicable.

BACKGROUND OF THE INVENTION

1. Field of the Invention

The invention relates to a device for detecting an obstacle in the opening range of a movable closure element. The closure element may be for example, an electrically powered window pane or sunroof of a motor vehicle. The device is provided with a sensor electrode having a first end and a second end, a base electrode having a first end and a second end and being spaced away from the sensor electrode, and a control unit connected to the first end of the sensor electrode and the first end of the base electrode. The sensor electrode and the base electrode generate an electric field in the opening range of the closure element and are spaced away from each other at a constant distance in a first operational mode. The control unit detects in the first operational mode a change in capacitance caused by the presence of an obstacle in the electric field and provides a control signal for a drive powering the closure element.

2. Description of Related Art

Such a device represents an anti-trap guard serving to prevent part of the human body, for example, being trapped between the closure element and a frame surrounding the closure element at least in part. By the way they work, these known devices are distinguished as a direct working and an indirect working anti-trap guard, as described for example, in DE 199 06 562 A1. A direct working anti-trap guard is understood to be a device or system comprising sensors which directly detect an obstacle and communicate a corresponding signal to an electric motor powering for example, a window pane, unlike an indirect working anti-trap guard which detects the load acting on the electric motor and determines the presence of an obstacle by processing the specific parameters of the electric motor. For a direct working anti-trap guard a wide variety of sensors can be used. Depending on the nature of the sensor, known devices can be distinguished by anti-trap guards requiring physical contact with the obstacle and anti-trap guards sensing the proximity of the obstacle non-contactingly.

One anti-trap guard belonging to the first group is described in EP 0 638 701 B1. This tactile anti-trap guard comprises a weatherseal sealing a closure element and is provided with two electrically conductive portions each separate from the other. On physical contact with an obstacle in the opening range of the closure element the conductive portions are squeezed together resulting in a switching contact triggering an electrical control signal. A tactile anti-trap guard also reads from DE 199 13 105 A1.

Unlike the former, a proximity anti-trap guard is known from EP 0 648 628 B1. This known anti-trap guard comprises an extruded weatherseal in which an electrical conductor is integrated. The electrical conductor represents a sensor electrode which generates an electric field in the opening range of a window pane. Changes in the capacitance due to the presence of an obstacle in the electric field are detected by a control unit which provides a control signal for a motor powering the window pane. Should an obstacle nevertheless come into contact with the weatherseal, the motor is reversed as soon as the force exerted by the obstacle on the window pane exceeds a predefined maximum permissible value of, for example, 100 N. In this known anti-trap guard a change in the capacitance triggering a control signal for the motor also materializes when the position of a sensor electrode integrated in a movably mounted lip is altered by an obstacle.

In DE 43 20 548 C2 a device for the opening and closing of a side window of a motor vehicle is disclosed having a control unit which interrupts or reverses the drive of the side window as a result of a sensor signal. The sensor signal is obtained by the measuring of the capacitive resistance between two electrically conducting slot boundaries, for example by detuning an oscillating circuit or a Wheatstone resistance bridge. One of the slot boundaries is formed by a seal which seals the side window. The other slot boundary is either formed by an electrically conducting top edge of the side window or, if the conducting properties of the window are sufficient, by the side window itself. Changes in the capacitance occur if there is an obstacle present in a slot between the slot boundaries. A disadvantage of the known device is that the distance of the electrodes forming the slot boundaries is changed by moving the side windows so that the resulting change in capacitance has to be taken into account when generating the control signal.

A proximity anti-trap guard also reads from EP 1 154 110 A2. The way in which this known anti-trap guard works is based on a change in the capacitance prompted by an electrically conductive obstacle in an electric field generated between two electrical conductors. One of the two conductors, the sensor electrode, is integrated in a weatherseal sealing the closure element and receives a predefined electrical charge. It is in this way that a measuring capacitance can be determined between the sensor electrode and the other conductor, the base electrode which is grounded, for instance. This change in the measuring capacitance by an obstacle is determined by means of a control unit which provides a control signal for a drive powering the closure element. To also detect non-conducting materials, such as for example, wood or plastics causing no or only a very slight change in capacitance, this capacitive anti-trap guard features a soft-spot. This soft-spot is achieved by the portion of the weatherseal mounting the sensor electrode being configured deformable. In this way, contact of the obstacle with the weatherseal prompts a change in the position of the sensor electrode in relation to the base electrode, resulting in a change in the capacitance.

The last-mentioned document discloses in addition methods of monitoring proper functioning of sensor electrode and base electrode. A first method involves applying a DC signal to the open end of a sensor electrode configured in the form of a loop. A second method provides for applying to a sensor electrode featuring a free end a predefined signal which is reflected at the free end. From the differences in the transit time an open circuit in the sensor electrode, for example, can be detected. A third method involves comparing the capacitance between sensor electrode and base electrode to a predefined reference capacitance.

Described also in U.S. Pat. No. 6,389,752 B1 is a method for monitoring proper functioning of a tactile anti-trap guard. This known method involves circuiting a resistance between two electrical conductors, the resistance providing a constant impedance. The resistance reflects a signal pulse fed to the conductors, the transit time of which is detected by a control unit. Any deficiency in proper functioning of the anti-trap guard is detected by the difference in the transit time.

The disadvantage with such proximity devices is that the electric field generated by the sensor electrode is subject to disruptive effects which may detriment proper functioning and reliable operation. Thus, motion of the closure element is disruptive to the reference capacitance. Apart from this, malfunctioning may be caused by electromagnetic interference. Although electromagnetic compatibility (EMC) is achievable to a sufficient degree in principle by an electronic compensating circuit this makes the device unreasonably complicated.

BRIEF SUMMARY OF THE INVENTION

The invention is based on the object of sophisticating a device of the aforementioned kind to achieve high reliability in operation and availability by relatively simple and cost-effective means.

To achieve this object in a device having the above features, it is provided for in line with claim 1 that the sensor electrode and the base electrode are connected to each other at the second end by an electronic component wherein an insulation testing voltage is fed to the sensor electrode and the base electrode and wherein the sensor electrode and the base electrode in a second operational mode have a changeable distance to each other and wherein the control unit in a second operational mode additionally provides a control signal for the drive powering the closure element when the sensor electrode comes into electrical contact with the base electrode.

The device in accordance with the invention makes use of having discovered that combining a capacitive and tactile anti-trap guard into a single function unit achieves high reliability in operation and availability. Now, when the electric field generated in the opening range of the closure element is disrupted in detrimenting or even preventing proper detection of an obstacle in the opening range by analysis of the change in capacitance, the tactile anti-trap guard formed by the electrical contact of sensor electrode and base electrode ensures that a control signal is furnished nevertheless for the drive powering the closure element. This redundancy provided by the additional tactile anti-trap guard thus ensures highly reliable operation. Apart from this, the tactile anti-trap guard now makes it possible to configure the control unit simple and cost-effective, since the electronic circuit forming the basis of the control unit requires basically no components for compensating electromagnetic disturbances of the electric field. As compared to the combination known from EP 0 648 628 B1 of a capacitive anti-trap guard and an indirectly working anti-trap guard the device in accordance with the invention excels by a fast response even for relatively low trapping forces of, for example, 10 N to 25 N.

Since the sensor electrode and the base electrode are connected to each other at the second end by an electronic component and a testing voltage is applied to the sensor electrode and the base electrode, it is possible to permanently monitor proper functioning of sensor electrode and base electrode by means of the testing voltage. Therefore, any malfunction due to an open circuit or short-circuit is instantly detectable. Connecting sensor electrode and base electrode by the component preferably acting as AC current limiting choke results in coupling of a capacitive and tactile anti-trap guard in accordance with the invention, thus generating a synergetic effect which ensures high availability and reliable operation.

Advantageous aspects of the device in accordance with the invention read from claims 2 to 10.

It is of advantage if the control unit in the second operational mode additionally provides a control signal for the drive powering the closure element at a change of the relative position of the sensor electrode and the base electrode. This way, an obstacle made of a non-conducting material which does not significantly influence the electrical field generated in the opening range of the closure element can already be detected when the positioning of the sensor electrode and base electrode is changed relative to each other by the obstacle.

Furthermore it is of advantage if the electronic component exhibits an ohmic and/or inductive and/or capacitive resistance. Especially an inductive resistance enables an easy delimitation of the AC currents resulting from the voltage fed to the sensor electrode and the base electrode.

In one preferred aspect of the device in accordance with the invention a weatherseal sealing the closure element is provided which is made of an elastomer, preferred ethylene propylene diene terpolymer (EPDM) and secured to a frame surrounding the closure element at least in part. The, for example, extruded weatherseal now makes it possible to fabricate an arrangement of sensor electrode and base electrode as called for in practice for generating an electric field in the opening range of the closure element. The weatherseal expediently features a fastening portion disposed on the frame and at least one sealing lip contacting the closure element to ensure, for one thing, simple assembly and, for another, reliable sealing.

It is furthermore of advantage to configure the sensor electrode and/or the base electrode as strips of metal embedded in the weatherseal and spaced away from each other by a hollow chamber. The hollow chamber ensures that the sensor electrode and base electrode can each move relative to the other in achieving a tactile anti-trap guard. The size of the hollow chamber permits defining the degree of deformation needed to bring the sensor electrode and base electrode in contact with each other due to an obstacle. Thus, depending on how the hollow chamber is configured a soft-spot as described in EP 1 154 110 A2 can now be achieved, resulting in triple redundancy.

The strips of metal have preferably a round cross section, especially circular or oval, but depending on the reach and orientation of the electric field may also be configured polygonal, preferably rectangular or triangular. Furthermore, the sensor electrode and/or the base electrode may be surrounded to advantage by electrically conductive portions of the weatherseal spaced away from each other by the hollow chamber. The electrically conductive portions fabricated, for example, by co-extrusion protect the sensor electrode and base electrode from external ambient effects, for example, corrosion in thus contributing to high reliability in operation and long life of the device in accordance with the invention. As an alternative, the sensor electrode and/or the base electrode may be configured exclusively as electrically conductive portions of the weatherseal spaced away from each other by a hollow chamber.

In another preferred aspect of the device in accordance with the invention, when an obstacle exists in the opening range of the closure element the control unit detects a force exerted by the obstacle on the closure element and provides a control signal for the drive powering the closure element when the force violates a predefined maximum permissible value for the force. It is in this way that the device in accordance with the invention simultaneously achieves an indirect working anti-trap guard in thus achieving multiple redundancy as regards detecting an obstacle in the opening range of the closure element.

BRIEF DESCRIPTION OF THE SEVERAL VIEWS OF THE DRAWING(S)

The device in accordance with the invention will now be detained along with further advantages by describing a preferred example embodiment illustrated in the drawings merely diagrammatically in which.

DETAILED DESCRIPTION OF THE INVENTION

Figure 1:
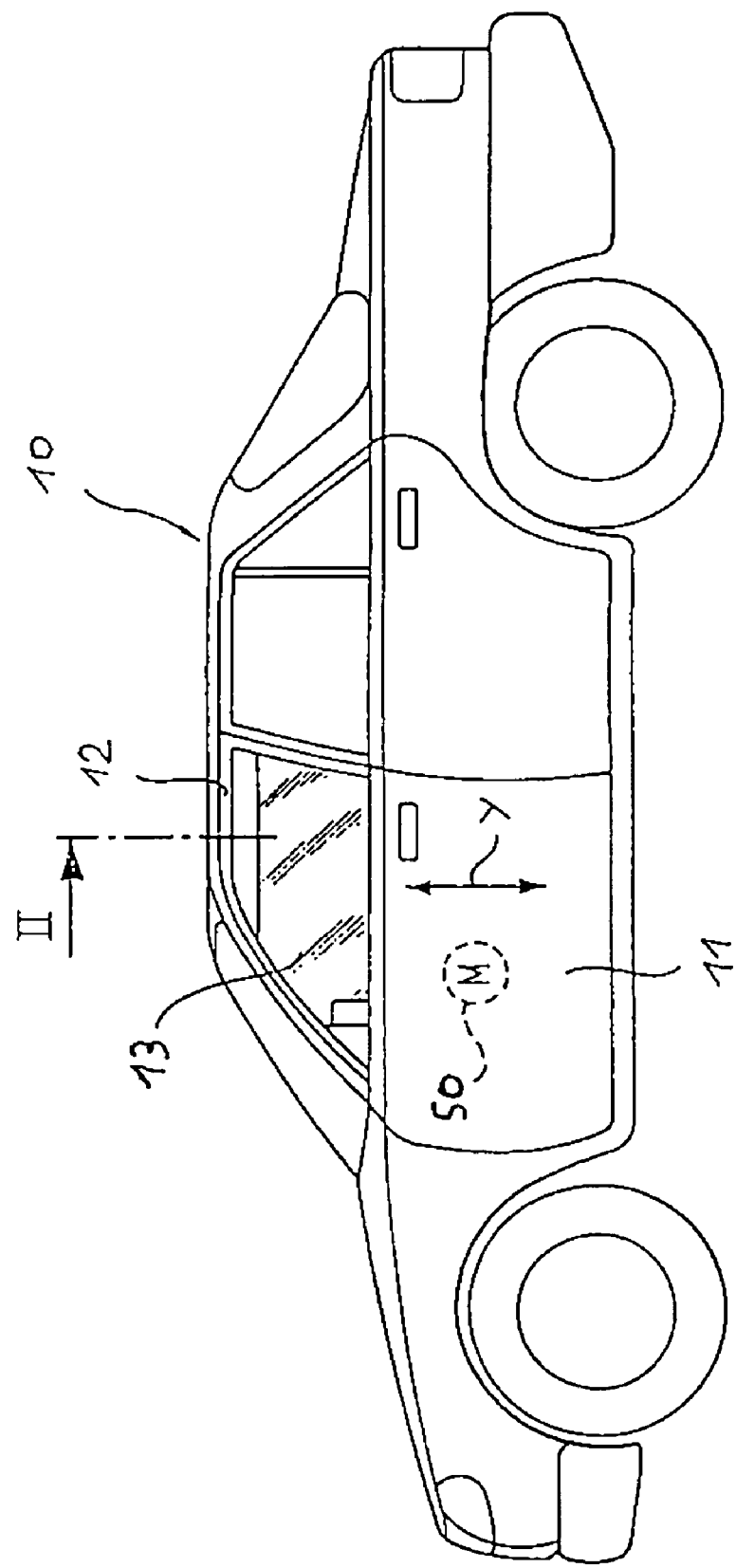
FIG. 1 is a side view of a motor vehicle.

Referring now to FIG. 1 there is illustrated the motor vehicle 10 featuring a window pane 13 powered by an electric motor 50 in the region of a door 11. The window pane 13 representing a closure element is movable in the powering direction y of the electric motor 50 between an open position and a closed position.

Figure 2:
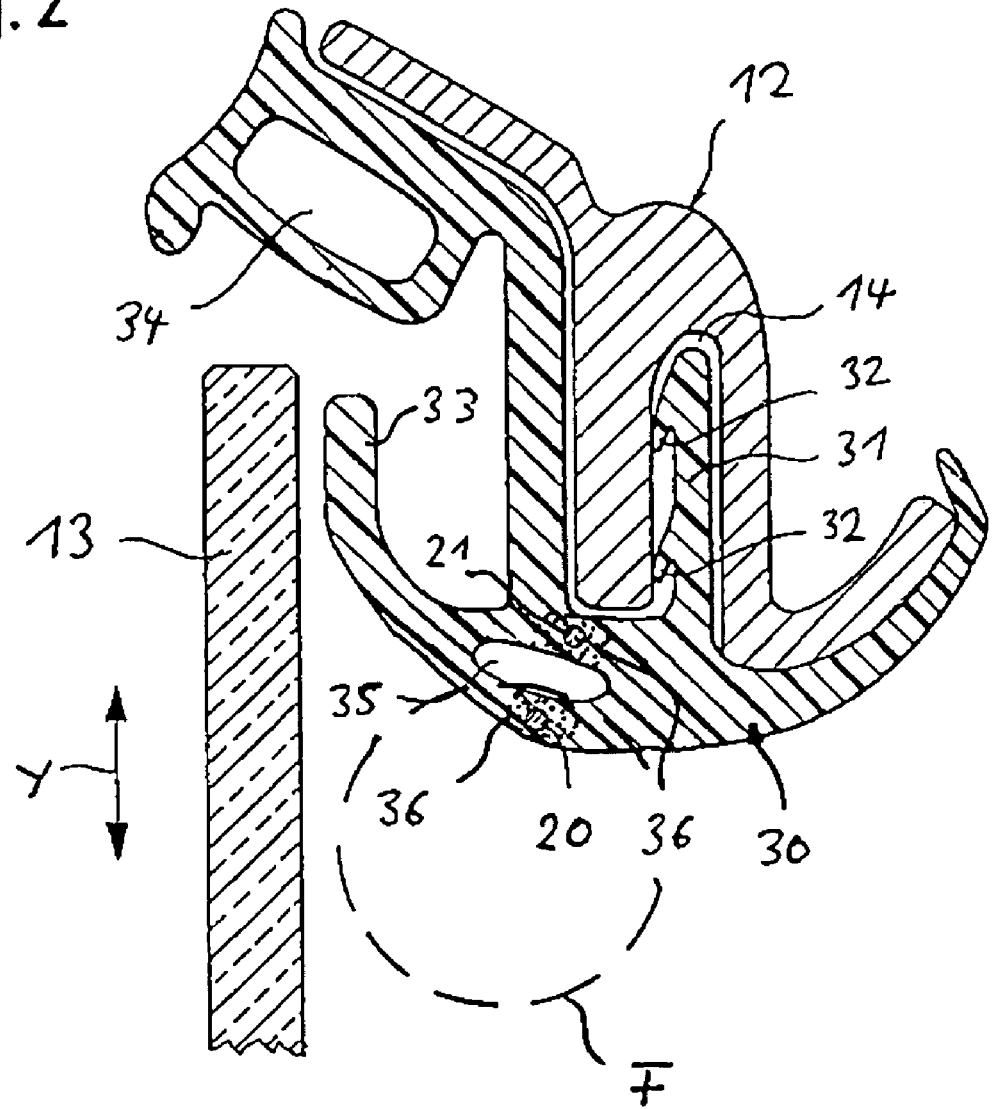
FIG. 2 is a section as taken along the line 11 in FIG. 1.

Referring now to FIG. 2 there is illustrated in more detail how the door 11 comprises a frame 12 to which a weatherseal 30 sealing the window pane 13 is secured. The weatherseal 30 made of an electrically non-conductive elastomer, for example, EPDM, comprises a fastening portion 31 defined in a channel 14 of the frame 12. For this purpose the fastening portion 31 is provided with retaining lips 32 producing a non-positive connection with the walls of the channel 14. The weatherseal 30 is provided furthermore with sealing lips 33, 34 which sealingly guide the window pane 13. In this arrangement the sealing lip 33 is in contact with a side surface of the window pane 13, whereas the sealing lip 34 configured as a hollow chamber seal abuts the edge of the window pane 13.

Furthermore, embedded in the weatherseal 30 are two strips of metal of circular cross-section forming a sensor electrode 20 and a base electrode 21. The sensor electrode 20 and the base electrode 21 are spaced away from each other by a hollow chamber 35 and each surrounded by an electrically conductive portion 36 fabricated, for example, by coextrusion.

Figure 3:
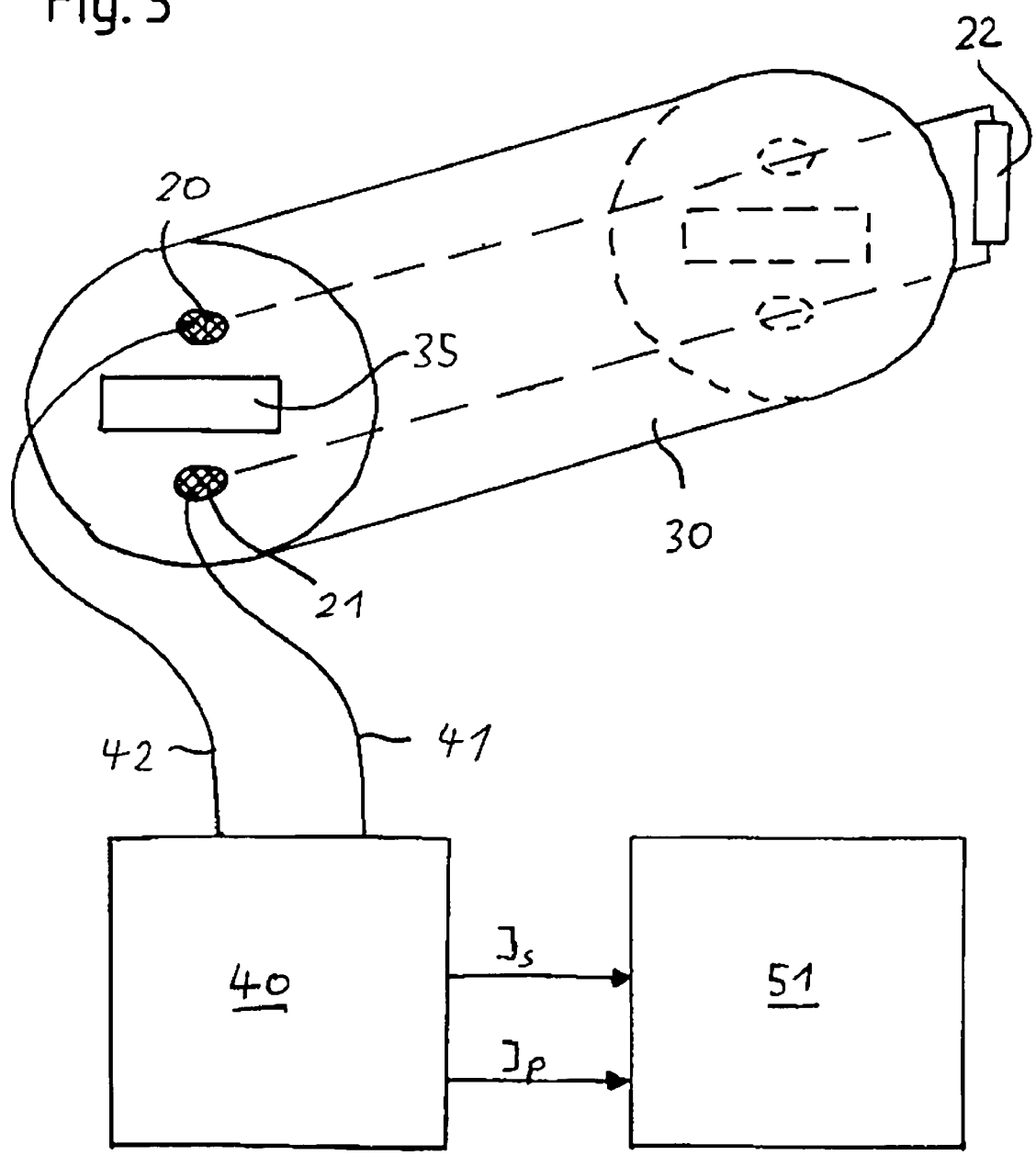
FIG. 3 is a diagrammatic view of how a sensor electrode and a base electrode are connected to a control unit in a first embodiment.
Figure 5:
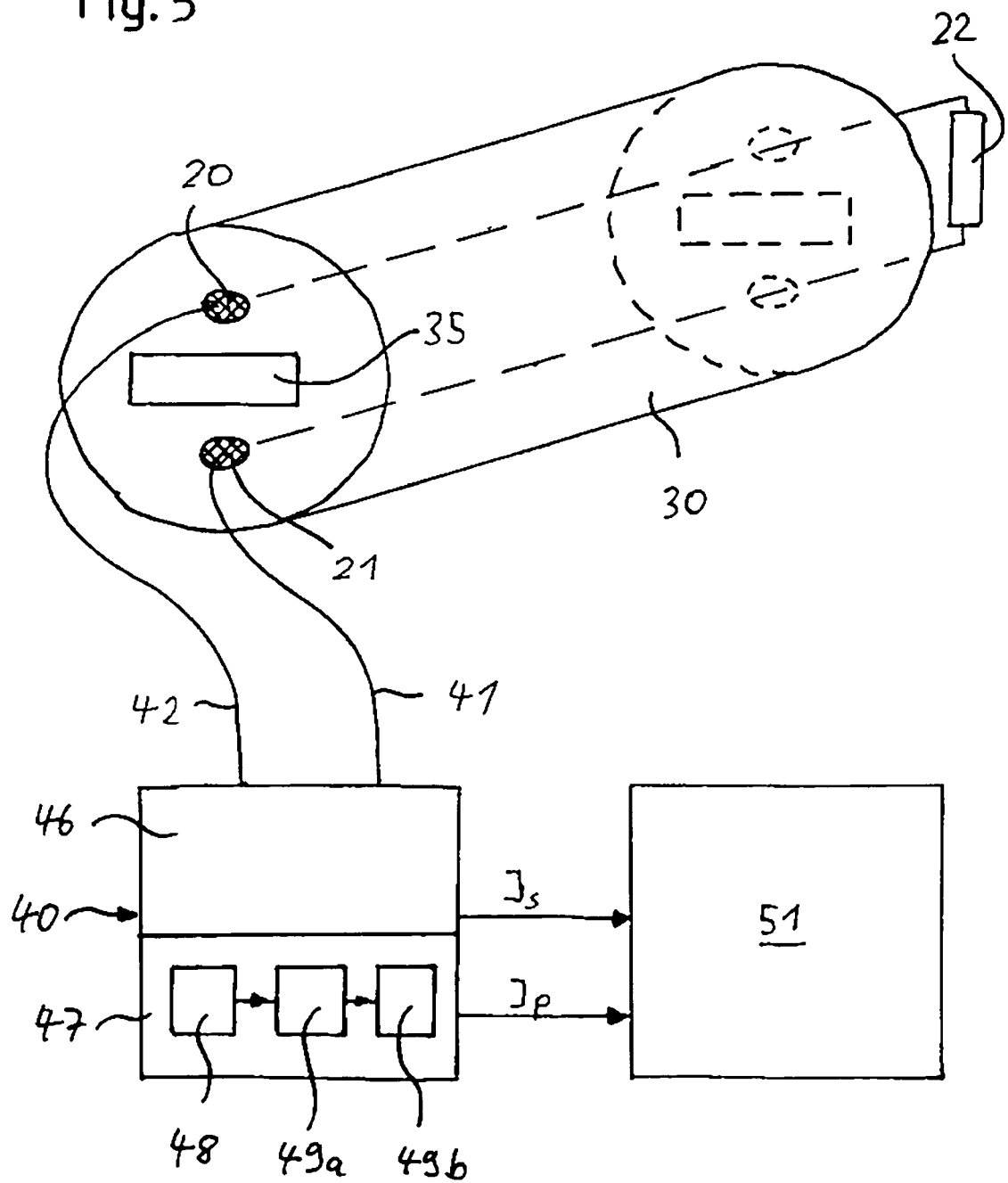
FIG. 5 is a diagrammatic view of how the sensor electrode and the base electrode are connected to a control unit in a second embodiment.

The sensor electrode 20 and base electrode 21 serve to generate an electric field F in the opening range of the window pane 13 as described in EP 1 154 110 A2 in thus making it possible by means of a control unit 40 as shown in FIGS. 3 and 5 connected to a first end of the sensor electrode 20 and a first end of the base electrode 21 by connecting leads 41, 42 to detect a change in the capacitance due to the presence of an obstacle in the electric field F in a first operational mode. In this way a control signal $I_s$ for a motor controller 51 controlling the electric motor 50 is provided. The control signal $I_s$ stops the electric motor 50, when necessary, or signals reversion of the motion of the window pane 13 to prevent the obstacle being trapped, for example, between the edge of the window pane 13 and the frame 12.

As evident from FIG. 2 the sensor electrode 20 is disposed in an outer portion of the weatherseal 30 facing the opening range of the window pane 13 in thus making it possible that an obstacle in the opening range of the window pane 13 to come into contact with the outer portion of the weatherseal 30 accommodating the sensor electrode 20 and deforming the outer portion. This deformation of the outer portion of the weatherseal 30 results in the sensor electrode 20 being displaced relative to the base electrode 21 because of the hollow chamber 35. The capacitive change involved can be detected by the control unit 40 in a second operational mode to generate a control signal $I_s$. The weatherseal 30 thus constitutes a soft-spot in the outer portion accommodating the sensor electrode 20.

The control unit 40 is additionally capable, in the second operational mode, of generating a control signal $I_s$ when the hollow chamber 35 is squeezed by an obstacle sufficiently to cause the electrical conductive portions 36 surrounding the sensor electrode 20 and base electrode 21 to come into contact with each other. The resulting electrical contact of weatherseal 30 and base electrode 21 creates a tactile anti-trap guard ensuring that any obstacle in the opening range of the window pane 13 is effectively and relatively detected even when the electric field F is subject to electromagnetic interference. The control unit 40 may also be configured so that a force exerted on the window pane 13 in the presence of an obstacle in the opening range of the window pane 13 is detected as a change in the load acting on the electric motor 50. As soon as a predefined maximum permissible value for the force or the current flowing through the electric motor 50 normally proportional to the force exerted by the obstacle on the window pane 13, is violated, the control unit 40 provides a control signal $I_s$ for the motor controller 51.

Referring now to FIG. 3, there is illustrated how the sensor electrode 20 and the base electrode 21 are connected to each other at a second end facing away from connecting leads 41, 42 by an electronic component which is a control resistor 22. The control resistor 22 acting as a choke permits applying a testing voltage $U_p$ to the sensor electrode 20 and base electrode 21 as evident from FIG. 4. The testing voltage $U_p$ makes it possible to permanently monitor proper functioning of sensor electrode 20 and base electrode 21. A malfunction, for example, due to an open circuit or short circuit results in a control signal $I_p$ being provided for the motor controller 51 and, where necessary, a warning indication alerted.

Figure 4:
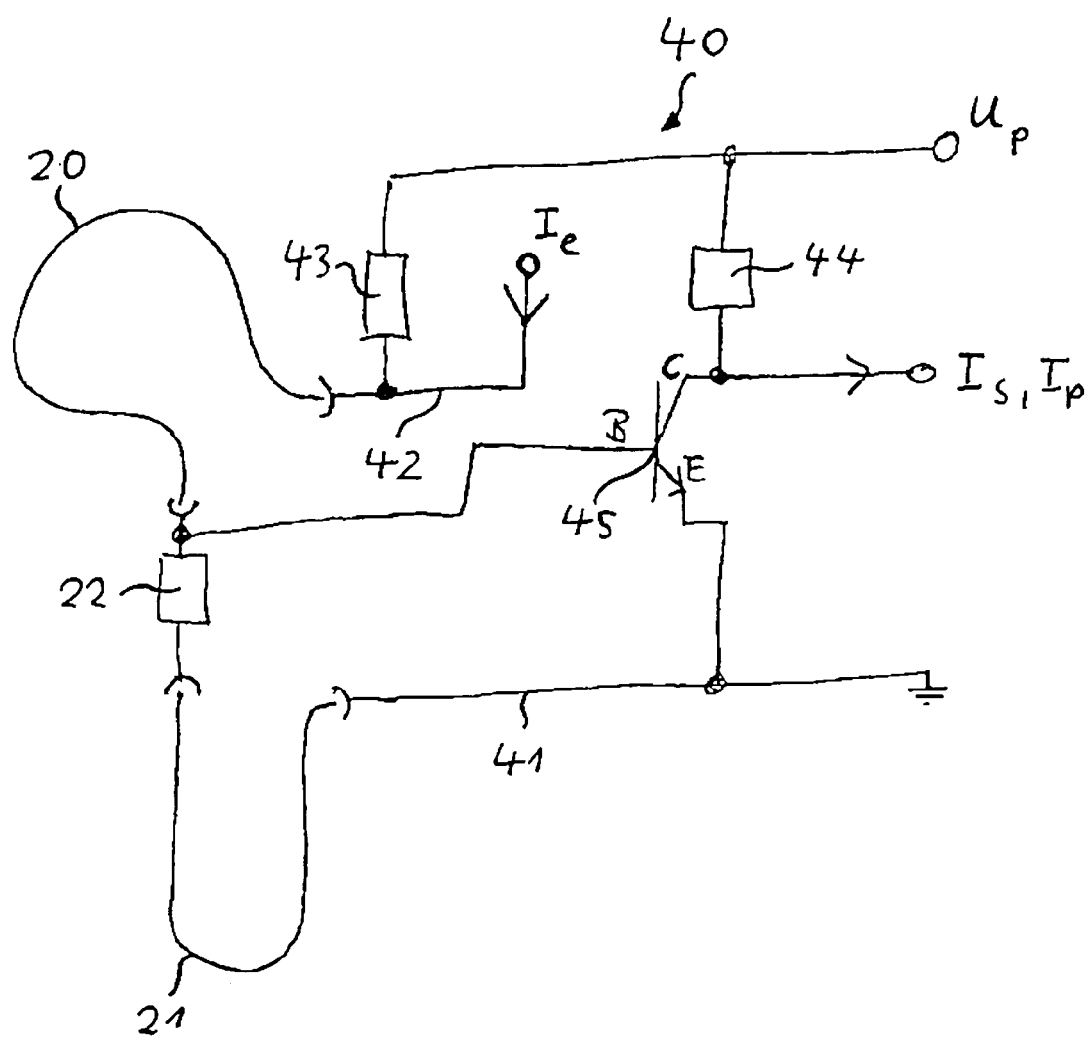
FIG. 4 is a circuit diagram of the control unit as shown in FIG. 3.

Referring now to FIG. 4 there is illustrated a circuit diagram showing the relatively simple configuration of the control unit 40 comprising just a few resistors 43, 44 and a transistor 45. Despite this simple configuration the control unit 40 makes it possible to furnish a sensor signal $I_e$ to the sensor electrode 20 to achieve a capacitive anti-trap guard by the electric field F generated thereby. The configuration of the control unit 40 simultaneously makes it possible to combine the capacitive anti-trap guard with a tactile anti-trap guard to achieve high reliability in operation and availability.

As evident from FIG. 5, the control unit 40 can include sensor electronics 46 enabling to recognize an obstacle due to a capacitive change and sensor electronics 47 enabling to recognize an obstacle due to an electrical contact of the sensor electrode 20 and the base electrode 21. The sensor electronics 47 is an analog circuit consisting of an operational amplifier 48, a pre-amplifier 49a and an output stage 49b and stands out by its comparatively quick reaction time and its independence from the motor controller 51.

Also contributing to achieve high reliability in operation and availability is the soft-spot resulting from the configuration of the weatherseal 30 and the active redundance as a result of the indirect detection of the obstacle by the load acting on the electric motor 50. The device thus characterized by its high reliability in detecting an obstacle can find application not just as an anti-trap guard for the window pane 13 but also for other closure elements on the motor vehicle 10, for example, a sun roof, a hatchback or trunk lid.

The invention claimed is:

1. A device for detecting an obstacle in the opening range of a movable closure element, more particularly an electrically powered window pane or sunroof of a motor vehicle, comprising a sensor electrode having a first end and a second end, a base electrode having a first end and a second end and being spaced away from said sensor electrode, and a control unit connected to the first end of said sensor electrode and the first end of said base electrode, said sensor electrode and said base electrode generating an electric field in the opening range of said closure element and are spaced away from each other at a constant distance in a first operational mode, and said control unit in the first operational mode detecting a change in capacitance caused by the presence of an obstacle in said electric field and providing a control signal for a drive powering said closure element, said sensor electrode and said base electrode being connected together at the second end by an electronic component, a testing voltage being applied to said sensor electrode and said base electrode which, in a second operational mode, have a changeable distance to each other, and the control unit providing in the second operational mode a control signal for said drive powering said closure element when said sensor electrode comes into electrical contact with said base electrode.

2. The device as set forth in claim 1 in which said control unit, in the second operational mode, provides a control signal for said drive powering said closure element at a change of the relative positioning of the sensor electrode and base electrode.

3. The device as set forth in claim 1 in which said electronic component exhibits an ohmic and/or inductive and/or capacitive resistance.

4. The device as set forth in claim 1 in which a weatherseal sealing said closure element is provided which is made of an elastomer, preferably ethylene propylene diene rubber, and secured to a frame surrounding said closure element at least in part.

5. The device as set forth in claim 4 in which said weatherseal expediently comprises a fastening portion disposed on said frame and at least one sealing lip contacting said closure element.

6. The device as set forth in claim 4 in which said sensor electrode and/or said base electrode are configured as strips of metal embedded in said weatherseal and spaced away from each other by a hollow chamber.

7. The device as set forth in claim 6 in which said strips of metal have a round cross-section configured preferably circular or oval or a polygonal cross-section configured preferably rectangular or triangular.

8. The device as set forth in claim 6 in which said sensor electrode and/or said base electrode are surrounded by electrically conductive portions of said weatherseal spaced away from each other by said hollow chamber.

9. The device as set forth in claim 4 in which said sensor electrode and/or said base electrode are configured as electrically conductive portions of said weatherseal spaced away from each other by a hollow chamber.

10. The device as set forth in claim 1 wherein, when an obstacle exists in said opening range of said closure element, said control unit detects a force exerted by said obstacle on said closure element and provides a control signal ($I_s$) for said drive powering said closure element when said force exceeds a predefined maximum permissible value for said force.

* * * * *

UNITED STATES PATENT AND TRADEMARK OFFICE
CERTIFICATE OF CORRECTION

PATENT NO. : 7,046,129 B2 Page 1 of 1
APPLICATION NO. : 10/795722
DATED : May 16, 2006
INVENTOR(S) : Regnet et al.

It is certified that error appears in the above-identified patent and that said Letters Patent is hereby corrected as shown below:

Front page, column 1, (73) Assignee:
    Delete Metzler and insert Metzeler

Signed and Sealed this

Fifth Day of September, 2006

JON W. DUDAS
*Director of the United States Patent and Trademark Office*